(12) United States Patent
O'Riordan et al.

(10) Patent No.: US 8,949,203 B1
(45) Date of Patent: Feb. 3, 2015

(54) VERIFICATION OF DESIGN LIBRARIES AND DATABASES

(75) Inventors: Donald J. O'Riordan, Sunnyvale, CA (US); James McMahon, Singapore, CA (US); Pei-Der Tseng, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/348,056

(22) Filed: Jan. 11, 2012

(51) Int. Cl.
*G06F 7/00* (2006.01)

(52) U.S. Cl.
USPC .......................................... 707/694; 707/805

(58) Field of Classification Search
USPC ......... 707/662, 687, 694, 805, 819, 820, 690, 707/812, 999.107; 716/100, 106, 107, 108
See application file for complete search history.

(56) References Cited

U.S. PATENT DOCUMENTS

| | | | |
|---|---|---|---|
| 5,623,418 A * | 4/1997 | Rostoker et al. | 716/102 |
| 7,191,165 B2 * | 3/2007 | Bergeron | 707/690 |
| 7,962,633 B1 * | 6/2011 | Sidebottom et al. | 709/229 |
| 2001/0018746 A1 * | 8/2001 | Lin | 713/201 |
| 2003/0220920 A1 * | 11/2003 | Lake et al. | 707/6 |
| 2007/0004393 A1 * | 1/2007 | Forsberg et al. | 455/420 |
| 2008/0046434 A1 * | 2/2008 | Nelson | 707/9 |

* cited by examiner

*Primary Examiner* — Greta Robinson
(74) *Attorney, Agent, or Firm* — Sawyer Law Group, P.C.

(57) ABSTRACT

Method and system for verifying data in a database. In one aspect, verifying data includes receiving an indication of at least one policy, the at least one policy including at least one rule. A verification process is initiated on target data by implementing the at least one policy, where implementing the at least one policy includes instantiating and applying the at least one rule. The at least one rule causes at least one verification check to be performed on the target data.

18 Claims, 8 Drawing Sheets

VERIFICATION OF DESIGN LIBRARIES AND DATABASES

FIELD OF THE INVENTION

The present inventions relate to circuit design and other forms of design using computer systems, and more particularly to design libraries and databases used in computer-implemented designs.

BACKGROUND OF THE INVENTION

Computer-enabled creation of designs is used in a wide variety of different applications and industries to allow the design of products to be more efficient and economical. One common application is electronic design automation (EDA), in which the designs for electronic components such as integrated circuits, circuit boards, and other components are created, viewed, and edited using graphical software applications implemented by computer systems. Such circuit design can include schematic or symbolic designs, physical layout designs, and other types of designs including components, electrical interconnects, power sources, etc. In some cases, designs are organized into "Intellectual Property (IP) cores," which are standardized packaged designs for products which can be exported to or imported from other organizations or entities and used as the foundation and changed as necessary to create similar designs and products or use the design in a different context. To produce such IP cores and designs more quickly and efficiently, organizations may use design flows, which are standardized procedures and rules which all stages of the design must follow to maintain consistency and reduce inefficiency and errors in the design process.

EDA designs typically reference libraries of data that describe designs and standardized components of designs. This data can include cells, which are descriptions of designs or components of designs. For example, a cell can be a block having inputs and/or outputs and which can be used with other cells to create a more complex design. The library data can also include cellviews, which are one or views associated with each cell, each cellview having a particular format in which to view its associated cell, such as a schematic view, physical layout view, text description view (such as VHDL or Verilog HDL), etc. Design and reference libraries typically include hundreds to thousands of cells and each cell may have several cellviews.

As part of an IP core export or import strategy to produce a fully functional core design, ensuring that all cellviews and other data in referenced libraries are correct and compatible with one or more design flows can be very time consuming due to a combination of complexity and quantity. Fixing libraries and adding additional tool/flow support can also be very resource intensive.

For example, the fundamental verification of a design, including correctness and compatibility checks, that needs to be performed before finalizing (e.g., "releasing" or "qualifying") a design or IP core library includes several different tasks. One example is verifying that all cellviews are up to date, e.g., a layout view is not older than a schematic view. Another example is verifying that data across all cellviews are consistent, e.g., the same pin names are present across all views. An additional task is to verify that data meets desired quality metrics, such as using design rule check (DRC) software to determine whether the physical layout of a particular design layout satisfies recommended design rules and parameters, using Layout Versus Schematic (LVS) verification software that determines whether a particular integrated circuit layout corresponds to the original schematic or circuit diagram of the design, or checking whether electronic constraints are met. In another example task for verification, easily automated tasks can be repeated, such as testing scripts providing automated functions or physical and design verification. Another example includes enforcing company-mandated data and flow standards, such as naming conventions. Also, fundamental database format integrity checks can be performed, such as a scan using oaScan, an application from Cadence Design Systems, Inc. that scans the contents of a library and checks for and repairs inconsistencies or data corruption in databases. In addition, metrics can be gathered, such as individual cell utilization, areas, device usage, etc., which may be desired for an importer of an IP core design, for example.

Despite the need for such thorough verification procedures of database libraries used for designs, design teams tend to run only a subset of the required number of tests and verification procedures, and do so in an ad-hoc manner. For example, many of the above verification tests are only run interactively or manually, and not in a fully automated manner. Exhaustive testing is not generally performed due to lack of an appropriately comprehensive and configurable system to enable such testing. This lack of systematic and comprehensive verification leads to subsequent integration issues and recalls of manufactured products. For example, integration failures can result in delayed tapeouts of integrated circuits and create additional inefficiencies in having to re-address the underlying errors or other issues in the design.

SUMMARY OF THE INVENTION

Methods and systems for verifying data in libraries or other databases are disclosed. In one aspect, a method for verifying data includes receiving an indication of at least one policy, the at least one policy including at least one rule. A verification process is initiated on target data by implementing the at least one policy, where implementing the at least one policy includes instantiating and applying the at least one rule. The at least one rule causes at least one verification check to be performed on the target data. In addition, a computer program product including a computer readable medium provides program instructions for verifying data and provides similar features.

Some embodiments can include various features. For example, the target data can be stored in at least one database, and the verification process can be performed by a linter engine on the target data. The at least one database can be at least one electronic design automation (EDA) database and the target data can be used in a circuit design. The verification check can check the target data by performing at least one correctness or compatibility check on the target data, such as verifying cellviews are up-to-date, verifying that data across the cellviews is consistent, etc. The at least one rule can be stored in a rule library separate from the at least one policy and separate from the linter engine, and the at least one policy can be stored in a policy library separate from the linter engine and separate from the at least one rule. The at least one policy can reference at least one sub-policy of the policy. At least one policy option can be provided in the at least one policy to override a corresponding attribute of the at least one rule and customize the at least one verification check, and/or at least one user override can be received to override the at least one policy option. The at least one policy can be provided in a base template file and can be inherited by an extension file referring to the base template file, where the extension file can include modification(s) that replace a corresponding portion of the at least one policy. The linter engine can check a user-customized predefined order of locations in a storage system to find the at least one policy and the at least one rule.

In another aspect, a verification system includes one or more storage devices storing at least one library including at least one policy and at least one rule. At least one processor in communication with the one or more storage devices receives an indication of at least one policy, the at least one policy including at least one rule, and initiates a verification process on target data by implementing the at least one policy. Implementing the at least one policy includes applying the at least one rule, wherein the at least one rule causes at least one verification check to be performed on the target data. In some examples, the target data can be stored in at least one database, the verification process can be performed by a linter engine on the target data, and the linter engine can instantiate the at least one policy from a policy library and instantiate the at least one rule from a rule library for the verification process.

Embodiments disclosed herein allow the use of an extensible and customizable verification process to thoroughly check complex and scattered data for errors and for compliance to a design flow and other requirements, thus reducing time and effort in the completion of and correction of issues in complex designs.

DETAILED DESCRIPTION

Figure 1:
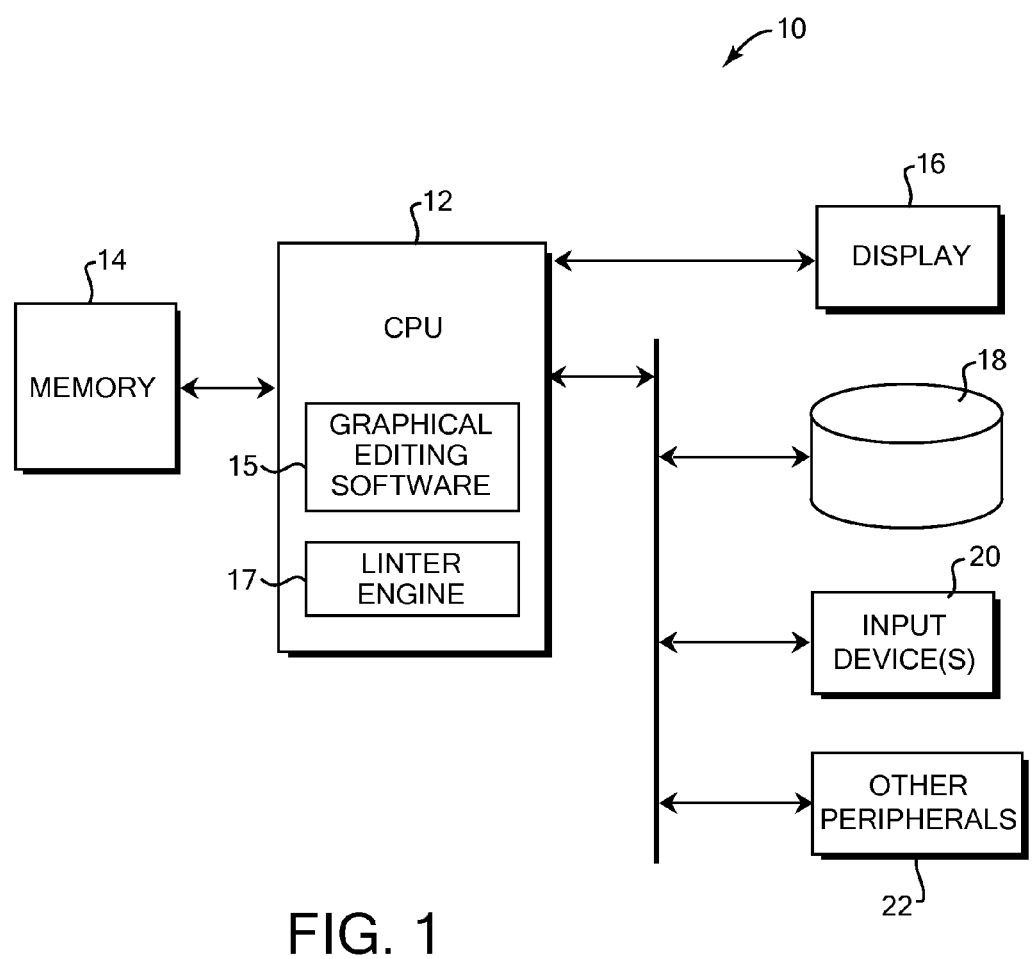
FIG. 1 is a is a block diagram illustrating a system suitable for use with one or more embodiments disclosed herein.

The present embodiments relate to circuit and other product design using computer systems, and more particularly to design libraries and databases used in computer-implemented designs. Various modifications to the described embodiments and the generic principles and features described herein will be readily apparent to those skilled in the art. Thus, the present embodiments are not intended to be limited to the examples shown but is to be accorded the widest scope consistent with the principles and features described herein.

The present embodiments are mainly described in terms of particular methods and systems provided in particular implementations. However, one of ordinary skill in the art will readily recognize that these methods and systems will operate effectively in other implementations. For example, system implementations usable with the present embodiments can take a number of different forms. The present embodiments will also be described in the context of particular methods having certain steps. However, the methods and systems operate effectively for other methods having different and/or additional steps not inconsistent with the present embodiments.

The embodiments described herein can take the form of software embodiments, hardware embodiments, or an embodiments containing both hardware and software elements. A hardware embodiment can utilize logic gates, processors, electronic components, and other hardware elements. A software embodiment can include but is not limited to firmware, resident software, microcode, etc. run by a processor or processing circuit. Furthermore, the some embodiments can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), flash memory, a rigid magnetic disk, an optical disk, and a solid-state memory drive. Current examples of optical disks include compact disk read only memory (CD-ROM), compact disk read/write (CD-R/W), DVD, and Blu-ray.

The embodiments herein enable verification of target data in a database. Features of these embodiments allow users to manage large amounts of complex data in a design, such as making sure library data used in the design is consistent, compatible, and has reduced errors over all stages, functions, and portions of the design. Hierarchical features allow a user to create, customize, and extend a desired verification policy using smaller building blocks such as rules that implement verification checks and policies including sub-policies and rules. Override features allow a user to customize even further the existing verification building blocks. Inheritance features allows users to create alternate or extended functions for verification tests and have those alternates easily incorporated into existing policies and verification rules. Lookup features allow automatic retrieval of relevant polices and rules based on current context or options. All these features allow users to export and import complex designs with minimal issues in making the designs compatible for use in different contexts or applications.

To more particularly describe the features of the described embodiments, please refer to FIGS. 1-10 in conjunction with the discussion below.

In order to address the problems of prior verification systems in a design flow environment, a database verification or "linting" system can be used as described herein. A linting engine flags suspicious constructs in the data of a design, including incompatible and incorrect content and structures based on known rules and requirements. For example, the verification system described herein can be used to check and verify contents of design libraries, reference libraries and databases to ensure that the contents of those databases comply with user- and/or system-defined policies.

Features described herein can be used in a variety of applications to verify database data. For example, one or more features can be used to check/verify database quality prior to release (e.g., IP authoring flow). In one example, the database quality can be verified prior to releasing a new version of a standard cell library or reference flow design database to a customer. One or more features can also be used to fix detected database issues and also to automatically create additional flow enablement including database migration. One or more features can also be used to check database quality prior to integration of the database data with a design and/or other libraries (e.g., IP integration flow). "IP" is used herein to refer to "intellectual property" in the sense of IP cores, which are designs that can be used as standardized functional blocks in creating integrated circuits.

Various users use the verification system which provides numerous features described herein. Some users are individual persons, while other users may be part of a group such as a "CAD group," which is a particular group within a design organization. Other types of user groups can be present in other applications and embodiments. The user groups can be additionally organized into different types. For example, CAD groups can include a central CAD group, a site-specific CAD group, a project-specific CAD group, etc. Some users are "expert users" in the sense that they can develop detailed features of system software, such as the templates described herein. Expert users can be programmers, a CAD group that controls software for an organization (who, for example, can add customized code or extension code to existing vendor-supplied software), etc. "End-users" can be users who typically do not know advanced programming techniques and are reliant on simpler interfaces to perform customization. These users can include individual persons. In some embodiments, "users" can include persons as well as other programs that interface with the system.

Features described herein can provide a flexible platform for defining policies for verification, capturing specific rules to check, and performing verification of the rules on target data as well as supporting automated fixing and flow execution for easily encapsulated tasks.

Features described herein allow rules and policies to be extended (inherited) and customized, and provide a hierarchical structure for policies and rules, e.g., allowing policies to be hierarchically decomposed into smaller building blocks. During rule and policy composition, default attributes of the rules and policies can be applied or overridden as the user desires. Further, a programmable or customizable lookup scheme allows project- or site-specific policy library and rule libraries to be specified and located for use at run time. Graphical user interfaces (GUIs) can be employed for interactively specifying the inheritance mechanisms. Alternatively, a template based architecture can allow one or more of the described features to be performed and captured in a textual/file-based mechanism, such as in various examples described below. For example, advanced users can code inheritance using template language details as described herein, without using a GUI.

FIG. 1 is a block diagram illustrating a system 10 suitable for use with the present invention. System 10 can be any suitable computer system, server, or other electronic or hardware device. For example, the system 10 can be implemented in a mainframe computer or server, desktop computer, workstation, portable computer, or electronic device (set-top box, portable device, cell phone, personal digital assistant, media player, game device, etc.). System 10 includes a CPU 12, memory 14, display device 16, storage device 18, input device(s) 22, and other peripherals 24.

CPU 12 can be one or more processors or processing circuits to execute program code and control basic operations of the system 10, including processing operations, manipulating data, issuing commands to other components of the system 10, etc. For example, an operating system can run on the system 10 and is implemented by the CPU 12 and other components of the system 10. CPU 12 can also implement graphical design software 15 and linter engine software 17, as described further below.

Memory 14 is typically provided in system 10 for access by the CPU 12, and can include one or more of a variety of types, such as random access memory (RAM), read-only memory (ROM), Electrical Erasable Read-only Memory (EEPROM), Flash memory, etc.

Display device 16 outputs displayed images to a user of the system 10. Display device 16 can be any of a variety of types of displays, including LCD, Plasma, CRT, etc. Some implementations of the display device 16 include a screen having a screen size, e.g., an area within which images are displayed. In some embodiments, the CPU 12, and/or a different processor in communication with the display device, can cause the display of images on the display device by providing the appropriate signals to well-known components of system 10 used in displaying images on device 16.

Storage device 18 can store data that may be retrieved by the CPU, including program instructions and/or the data for a library or database, including the target data to be verified in some embodiments described herein. One or more storage devices 18 can be provided in system 10 and/or provided in other systems and in communication with system 10, such as over a network or other communication link. Storage device 18 can be any of a variety of devices used to store data electronically, such as hard disk, hard disk arrays, solid-state memory (Flash, RAM, ROM, etc.), CD-ROM, DVD-ROM, Blu-Ray disc, magnetic tape, etc.

Input devices 20 can include any of a variety of devices that allow users to input commands and data to the CPU, including a keyboard, mouse, trackball, stylus, touchscreen, microphone/voice recognition device, motion sensors, other electronic device (such as another computer system or portable electronic device), or other input device. Other peripherals 22 can include any other devices connected to and used by the system 10, such as any peripheral, card, or interface device that performs one or more functions and communicates with the system 10, such as network adapters that enable the system 10 to become coupled to other computer systems or devices through intervening private or public networks, scanners, printers, sensors, speakers, etc. In the example of FIG. 1, the display device 16 is connected to the CPU 12 by its own dedicated bus, while storage device 18, input devices 20, and other peripherals 22 are connected to a common bus that is also connected to the CPU. In other embodiments, the display device 16 and other devices can each have their own bus, or share one or more common buses. One or more of the buses or other links can be implemented using wires or wirelessly, according to any of well known standards and protocols.

The graphical editing application 15 and interface can be implemented at least in part by the CPU 12 (and/or other processor(s) of system 10) to allow the creation and editing of designs, such as circuit designs. The application 15 can cause the display of one or more images and/or interface on the display device 16 and receive input from one or more of the input devices 20 to control the functions of the application and interface. The software 15 can also be stored on storage device 18 and/or in memory 14.

Linter engine 17 can control verification of target data and can also be implemented by the CPU 12 or by a different CPU. In one example, the graphical editing application 15 can be implemented on one system 10 and linter engine software 17 can be implemented on a different system 10, with one or more target data databases implemented on yet a different system(s) 10 or storage device(s). Some of the functionality of linter engine 17 is described in greater detail below.

Figure 2:
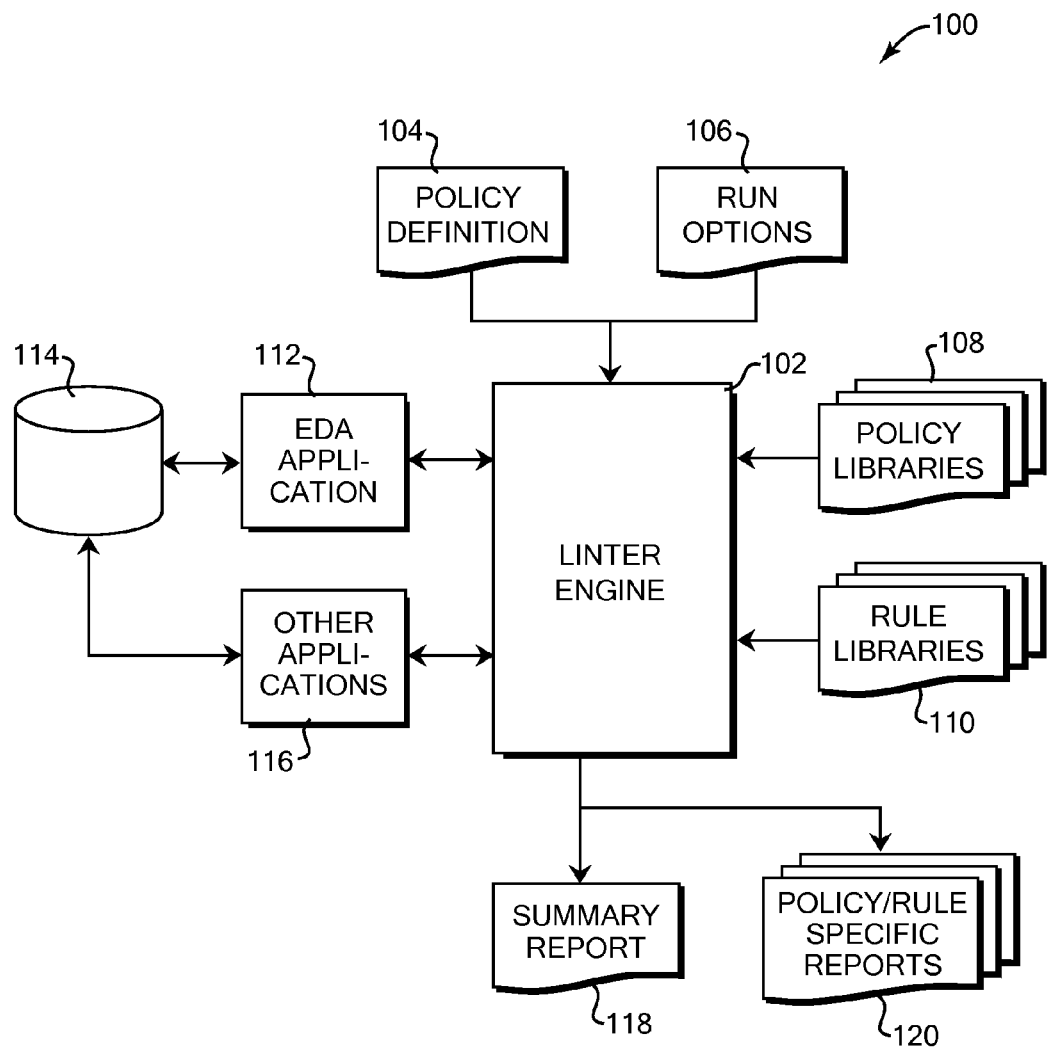
FIG. 2 is a block diagram illustrating an example of verification system and its inputs and outputs, suitable for one or more embodiments described herein.

FIG. 2 is a block diagram illustrating an example of a verification system 100 and its inputs and outputs, suitable for one or more embodiments described herein. This example shows several data flows as well as other components that interact in the system.

A linter engine 102 performs verification of target data using one or more features as described herein. The engine 102 receives several inputs, produces outputs, and interacts with other software and storage devices. The linter engine 102 can be implemented by one or more processors or processor circuits of a computer such as in system 10 shown in FIG. 1.

A policy definition 104 and run options 106 can be input to the linter engine 102. For example, a user (e.g. IP Author or library author) can select a predetermined policy definition, and/or can select or otherwise specify a set of run options for a policy, or these inputs can be provided by other mechanisms such as a different device or program. One example of selection of a policy definition and run options is described below with respect to FIGS. 3A-3B. A policy definition instantiates other (sub-)policy definitions and rules, where in some embodiments a rule appears at the leaf level in a policy definition hierarchy.

Policy definitions and rule definitions also can be input to the verification engine 102. The rule definitions define the particular rules used to verify (check) the target data and ensure it is correct and compatible with all other parts of the design, i.e., perform verification checks on the target data. The policy definitions define the particular rules and sub-policies are to be implemented and how they are to be implemented. The policy definitions can be stored in the policy libraries 108 and the rule definitions can be stored in the rule libraries 110. The libraries 108 and 110 can also be extended by the end user and/or user groups such as a CAD group. For example, policy definitions instantiated by the input policy definition 104 can be retrieved by the linter engine 102 from the policy libraries 108. Instantiated rule definitions can similarly be retrieved from the rule libraries 110. The policy and rule libraries 108 and 110 can be provided on one or more storage devices accessible to the linter engine 102. In some embodiments, policy library 108 and rule library 110 can be combined into a single library.

One or more libraries 114 are databases storing the target data which the linter engine 102 can verify, such as cell and component libraries and other data used in circuit designs or other types of designs. The libraries can be implemented on storage device(s) in communication with the linter engine, such as storage devices within the same computer system as a CPU running the linter engine, or on separate storage having a communication links to the linter engine system. In some embodiments, the linter engine 102 can communicate directly with the libraries 114, e.g., retrieving target data for rule verifications. In other embodiments, the linter engine can interface with the libraries via other applications or devices.

For example, an EDA application 112 can interface between the linter engine 102 and the libraries 114. One example of an EDA application provides creation and editing tools for a design, such as displaying all the various views of the design graphically and providing graphical user interfaces for designers. In some embodiments, after receiving or accessing a policy definition 104 and run options 106, the linter engine 102 can access and interact with the data of the libraries 114 using access and retrieval functions of the EDA application 112. One example of an EDA application 112 uses a generic data management (GDM) layer to access application libraries 114, which is utilized by the linter engine 102 using scripts or functions, e.g., scripts or functions written in the SKILL language as in examples provided below.

The linter engine 102 can also additionally interact with other applications 116, some of which can also access target data of the libraries 114. For example, there may be functions of other applications which are used in creating or editing designs and which can allow access to the libraries 114. These other applications 116 can be used similarly as the EDA application 112 to gain access to the target data. For example, a database integrity application can be accessed to perform some verification tasks on the target data. The other applications 116 to be used can be defined in rule definitions provided from rule libraries 110 or another source. For example, details of such interactions with other applications 116 can be captured in scripts for executing individual rules.

During the interactions between the linter engine 102 and other components, all the rules (checkers) from the policy hierarchy as provided in the policy definition 104 can be executed. These rules and policies can specify particular data in the libraries to verify, or specify the entire available libraries 114 to verify. After the target data from libraries 114 have been checked by the linter engine 102, the linter engine can output a summary report 118 that indicates the results of the verification checks on the libraries 114. In addition, individual reports 120 can be output, including policy-specific and rule-specific reports as defined by the policy definition 104 and any referred rules. For example, a policy report can include high level information as to overall results of the policy that was applied, and rule-specific reports can detail the results of each rule applied to the target data. In some embodiments, a policy report can present all results from its sub-policies and rules, e.g., in a hierarchical fashion that echoes the hierarchical organization of the sub-policies and rules within the policy.

Figure 3A:
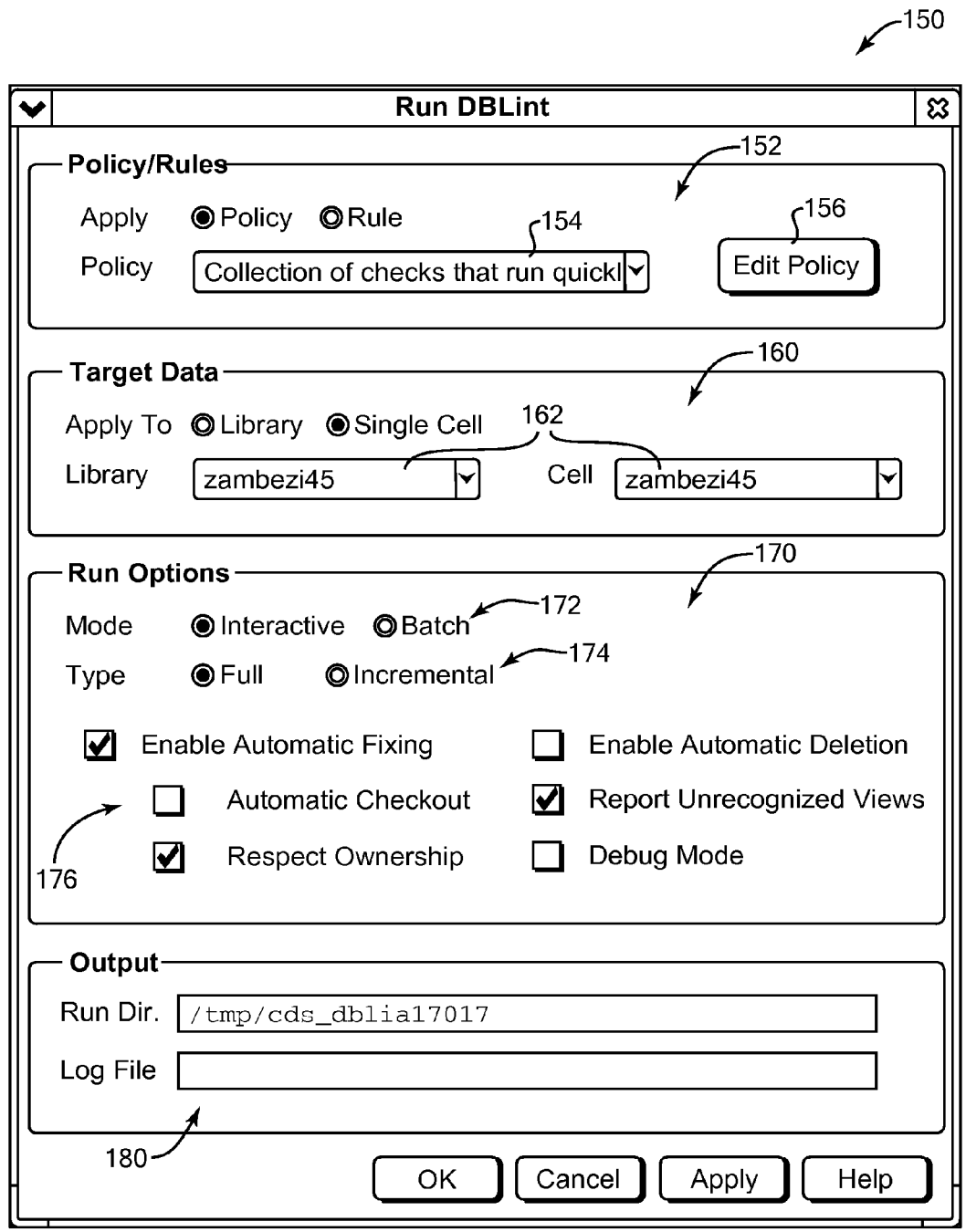
FIGS. 3A-3B are diagrammatic illustrations of examples of graphical interfaces which can be used to execute verification policies and rules to verify target data using the linter engine.

FIG. 3A is a diagrammatic illustration of one example of a graphical interface 150 which a user can utilize to execute verification policies and rules to verify target data using the linter engine 102. Interface 150 can be displayed on a display screen to a user to allow an end user, for example, to select displayed options in the interface 150. In the example of FIG. 3A, a user such as an IP author or integrator is configuring and is about to run a policy of rules that will quickly run on the verification system 100 (e.g., a "smoke-test"). The user has chosen to select a policy from a collection of policies and specify its target data and run options, in addition to its output options. The policy (and its constituent sub-policies/rules) can be loaded according to the programmable mechanism outlined herein.

In some embodiments, options can be presented in interface 150 to allow a user to override any corresponding default options or settings that may already exist in a selected policy or rule. For example, a policy or rule may include in its definition a default designation of target data, which can be overridden by the user selecting different target data in interface 150.

In the policy/rules section 152, the user can select to apply a policy or single rule for the verification test. The user can then specify a particular policy or rule in a drop-down menu 154 or other selection method. An edit button 156 allows the user to launch a policy editor interface and/or program by selecting the button. This editor interface allows the user to edit the policy (or rule) selected by menu 154. For example, the policy text can be displayed and the user can modify text of the policy using standard text-editing techniques. Alternatively, a graphical editor and/or graphical representations of the policy or rule features can be displayed.

The target data section 160 of the interface 150 includes options to allow the user to select whether to apply the above-selected policy or rule to an entire library or to a single cell. The drop-down menus 162 allow a user to select the particular library or cell to which the policy or rule is applied. In other embodiments, multiple libraries and/or particular cells can be selected as the target data.

The run options section 170 provides several options that allow the user to customize the verification of the target data. In the example of FIG. 3A, a mode option 172 allows the user to select an interactive mode allowing a user to adjust options or inputs during the verification process, or a batch mode that sequentially runs verification process(es) on one or more selections of target data and at a time predetermined by the user, without interaction or interruption. A type option 174 allows the user to select a full verification in which all of the data of the target data is verified, or an incremental verification in which only data is examined and verified that is newly added or changed since the last verification performed (or since a particular date which can be specified by the user).

Additional run options 176 can allow the user to select or deselect additional features and functions of the verification process of the linter engine. One option is automatic fixing, in which the verification process will automatically attempt to fix any errors found in the target data. An automatic deletion option similarly enables or disables whether the linter engine 102 will automatically delete data that is found during the verification process to be in error or is otherwise redundant or obsolete. An automatic checkout option enables or disables whether the linter engine 102 will "check out" or put a lock on the data being verified so that no other user or process can access or change the data during the verification process. A "report unrecognized views" option enables or disables reporting of views in the summary report 118 (or other output) that were not recognized by the linter engine. In one example, some views in the target data may have been created as temporary views during the design process and were neglected to be deleted after use; such views may not be desired to be included in a final design IP core being exported. A "respect ownership" option causes the linter engine 102 to enable automatic fixing of found incorrect data that is owned by the current user, e.g., data for which the current user has write access. This is useful as an extra level of protection in systems having different data or objects in used libraries owned by different users and/or in systems where users share a common workspace for designs. A debug mode can allow a user to view debug messages displayed during the verification process, e.g., detailed status messages as to the data found, errors found, and actions taken by the linter engine. Furthermore, the user may be able to provide debugging commands during a verification process to find causes of errors, start or stop particular functions, etc.

An output section 180 allows the user to specify one or more storage locations, such as a directory and/or filename, which the linter engine can write the output summary reports 118 and/or 120. This location can in some embodiments be a location such as a "run directory" in which the linter engine can store temporary files written and used during the verification process of the target data and deleted after the process is complete. A location can also be specified as to where the linter engine is to store a log file including output messages indicating actions taken by the linter engine or status of the verification process, e.g., with not as much detail as the debug mode.

Figure 3B:
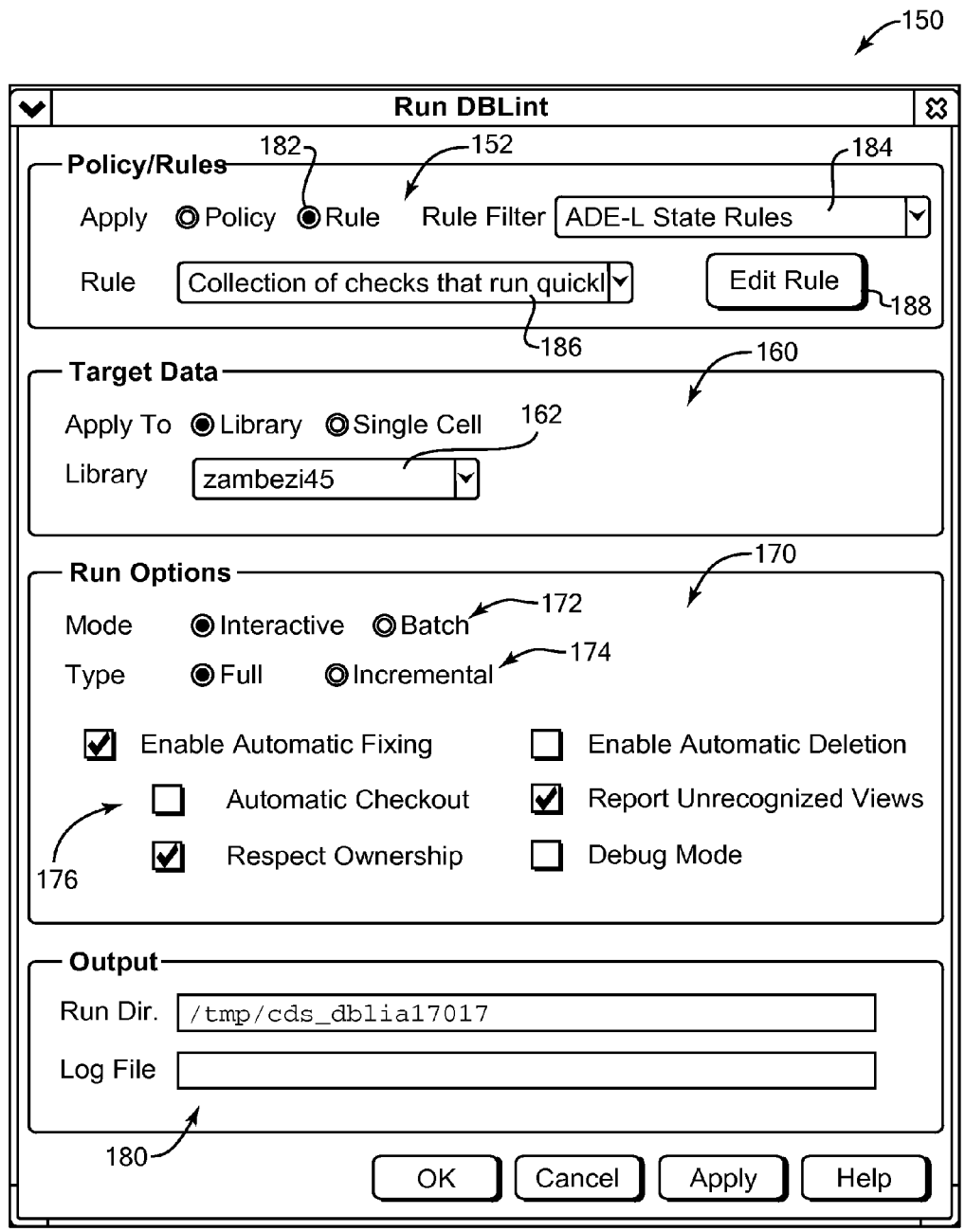

FIG. 3B is a diagrammatic illustration of the graphical interface 150 for the linter engine similar to the interface of FIG. 3A, except that a user a selected to apply a single rule to the target data rather than a policy. Thus, in interface 150 the user has selected the "Rule" toggle button 182 in the policy/rules section 152. The interface 150 changes its display and options in response to the selection. A rule filter drop down menu selector 184 allows a user to filter the class or type of rules available for selection. For example, meta-information can be specified in the "category" tag(s) in each rule, allowing the rules filter to be populated based on these tags.

The user can specify a particular rule to be applied by the linter engine in the drop down menu 186. An edit button 188 allows the user to launch a rule editor interface and/or program by selecting the button, similar to the policy editor resulting from button 156. The remainder of the rule application interface can be similar as the policy interface explained above for FIG. 3A.

In some embodiments, for convenience, the selection of a rule (such as with toggle button 182) can create an implicit policy having a single rule instantiation. The user can supply any rule options and overrides desired in the remaining portions of the interface 150.

The above GUIs of FIGS. 3A and 3B are oriented to an end user who is running the linter engine 104, i.e., applying specified rules and policies to target data and specifying any additional options needed. In some embodiments, a different GUI and/or set of GUI elements can be provided for an author or creator to use to create or author new rules, rule groups, and/or policies and/or edit existing rules, groups, and policies. Such a user may be a CAD department or other expert. For example, a menu or list can be provided in a GUI to allow a user to drag-and-drop rules from a rule list into a particular policy. Other GUI options can allow a user to create rules that run specified functions, are dependent on other rules or policies, create templates and extension files, and/or include other options and features.

The sample output log report below shows one example of a plain-text report summary 118 produced by linter engine 102 based on a verification process performed on target data.

LINTER LOG REPORT
POLICY NAME: quickTest
POLICY DESCRIPTION: Collection of checks that run quickly
IGNORED CELL NAMES:
IGNORED VIEW NAMES:
ACTIVE RULES—sorted by data type:
DATA TYPE: ALL_viewTypes
    Find Views By Type
    Lock File Check
    File Obsolete
    File Retired
    View Folder Contents
    Master.tag file reference
DATA TYPE: MaskLayout
    Empty Via Headers
    Pin Label Checks
    Layout XL Source Schematic Check
    Unbound Instance
    Terminal Crossview Check
    Empty cellview
    OaScan
DATA TYPE: VerilogText
    Terminal Crossview Check

| VIOLATION SUMMARY | | | |
|---|---|---|---|
| RULE | COUNT | FIXED | FINAL |
| File Retired | 2 | 0 | 2 |
| View folder contents | 1 | 0 | 1 |
| Empty Via Headers | 1 | 0 | 1 |
| Schematic Check | 4 | 0 | 4 |
| OaScan | 39 | 0 | 39 |
| Layout XL Source Schematic Check | 48 | 0 | 48 |
| Unbound Instance | 7 | 0 | 7 |
| Data access failure | 4 | 0 | 4 |
| File Obsolete | 77 | 0 | 77 |
| TOTAL | 183 | 0 | 183 |

GENERATED REPORT FILES (see "reports") sub-folder
/tmp/cds_dblia17017/reports/view_list.txt
checkLib: Errors found
See log file '/tmp/cds_dblia17017/dblint.log' for details
STATISTICS:
NUMBER OF CELLS PROCESSED TOTAL=78–WITH ERRORS=59
NUMBER OF CELLVIEWS PROCESSED TOTAL=297–WITH ERRORS=116
OTHER ERRORS=0
WARNINGS=1
START TIME=Feb 15 16:48:12 2011
STOP TIME=Feb 15 17:12:56 2011

This report summary indicates a particular policy "quick-Test" that was applied and the active rules applied by the policy for the verification process performed by the linter engine on the target data. The active rules are sorted by the data types to which the rules apply. For example, the ALL_viewTypes rules data type applies to all data in files and folders, the MaskLayout data type applies to features of a layout design, and the VerilogText data type applies to cells or other data provided in a text-based language.

A violation summary indicates violations of the active rules found during the verification process. For example, each applied rule is listed, along with the number of rule violations of that rule found, as well as the number of those violations that were automatically fixed by the linter engine 102 (automatic fixing of violations can be set by user preferences, for example). The name and location of generated report files are indicated, as well as statistics indicating the number of cells and cellviews processed, errors found, warnings and processing time for the verification process.

Hierarchical Composition

Figure 4:
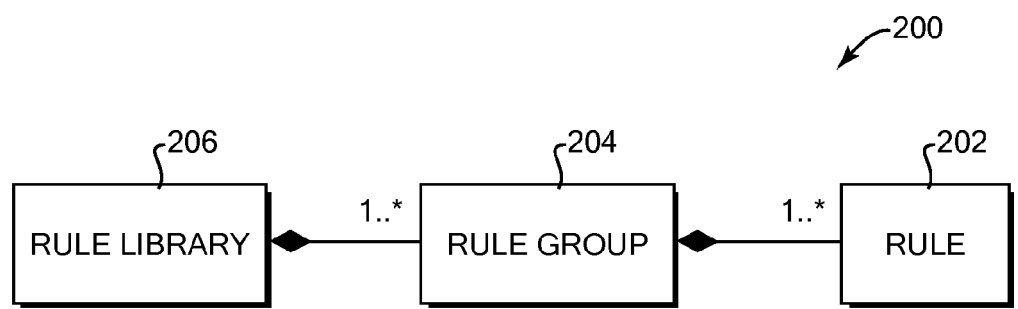
FIG. 4 is a block diagram illustrating one example of a representation of a rule hierarchy.

In the verification system 100 described herein, a rule can be defined as a single check of the target data based on one or more specified conditions or criteria in the rule. FIG. 4 shows one example of a UML representation 200 of a rule hierarchy as described herein. A rule class 202 can be seen as an association (e.g., a composition) of a rule group class 204, and rule group class 204 can be seen as an association (e.g., a composition) of a rule library class 206. Thus, one or more rules can be collected within a rule group, and one or more rule groups can be collected within a rule library. For example, related rules or rules of the same category can be arranged into a group, and multiple such groups can be included within a rule library.

Rules can be encapsulated using a registration and encapsulation scheme so as to provide a common interface. In example set forth below, rule checks can be coded in the SKILL language as scripts to run in an EDA application 112 and are called for execution by a rule using a function call. Other languages and implementations can be employed in other embodiments. Rules can be applied to single data class/type or cellview type or all views, cell, and libraries. Simple dependencies can be supported, where rules can depend on the outcome of other rules.

Figure 5:
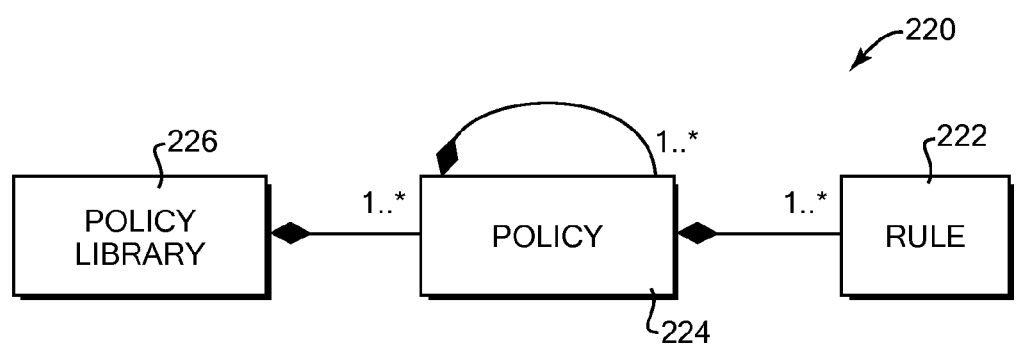
FIG. 5 is a block diagram illustrating one example of a representation of a policy hierarchy.

A policy can be defined for the systems described herein as a collection of rules and sub-policies to be applied to target data. FIG. 5 shows one example of a UML representation 220 of a policy hierarchy. A rule class 222 can be seen as an association (e.g., a composition) of a policy group class 224, and policy group class 224 can be seen as an association (e.g., a composition) of a policy library class 226. Thus, one or more rules and sub-policies can be collected within a policy group, and one or more policy groups can be collected within a policy library.

A policy is a list of rules to be checked, taking into account any customizable rule attribute settings associated with the rules. Policies can be organized hierarchically to include rules and/or lower-level policies ("sub-policies"). For example, a policy can include one or more policies (sub-policies to that policy) which can each themselves include one or more rules and/or policies. The rules in sub-policies are to be checked similarly to any rules in the higher level policy, along with any customizable policy attribute settings. Policies are typically determined by the particular design phase in which they are applied (e.g., a tape-out stage in an integrated circuit design and product) and the design flow and design flow standard(s) being implemented at the time of the verification process is performed (e.g., an AMS Foundation Flow as provided by Cadence Design Systems, Inc.). For example, a particular stage of a design flow may require that a particular set of rules be checked on the target data, and if the checks pass, then the next stage of the design flow can be entered or checked. Policies are stored within policy libraries. Similarly to rule libraries, the storage for a single logical policy library can be physically distributed across multiple disk files.

Rule, library and policy definitions support templating and programmable lookup in order to allow for customization. In some embodiments, to allow maximum power and flexibility, rule, rule library, and policy templates additionally support the object-oriented concept of inheritance. A language-based approach coupled with UML diagrams are used herein to describe examples of details. In some embodiments, a GUI can be provided that helps a user build up additional rules, libraries and execution scenarios (policies) by abstracting away at least some of the language details. A GUI (such as the examples of FIGS. 3A and 3B) can be provided to help users run the rules and policies in a verification process, and can additionally allow a user to interact with and browse the results of the verification process. Run options can also be provided as a set of run-time options that can override selected policy or rule default options/settings. These options can control execution, results logging, shared resource management, etc. as explained above.

Rules

Rules are the particular verification checks or tests that the linter engine 102 implements to check the correctness and/or compatibility of target data, and are the basis for implementing a verification process by the linter engine 102. The rules may be, for example, correctness and/or compatibility checks on the target data. For example, a rule may verify whether the target data satisfies a particular condition indicating the data's correctness and/or compliance with standards/conventions used by the data and/or by the linter engine. In some embodiments, a rule can be coded in a particular code or scripting language. For example, in some examples described herein a rule calls a function or script implemented in the SKILL language used by Cadence Design Systems, Inc. Other languages or scripts can be used in other embodiments. Functions and scripts to implement verification checks described herein are well-known to those of skill in the art. Rules can be applied to target data of a database, including one or more types of target data structures. For example, one or more rules can be applied to a single data class or type, or to the cellview type, or to all views, cells, and libraries. In some embodiments, the storage for a single logical rule library can be physically distributed across multiple disk files.

Rules also support dependencies, i.e., rules can depend on the outcome of other rules. For example, a rule that is dependent on a different rule need not be executed if the different rule has been found to be violated by the target data during a verification process. The dependencies allow redundant or irrelevant rule checks to be avoided based on the findings of previously-applied rules, saving time and processing in the verification process. For example, if a first rule is applied and the linter engine finds that a schematic view of a cell is missing, then there is no need to apply a dependent rule that checks the names of the schematic views; the dependent rule can be skipped.

Figure 6:
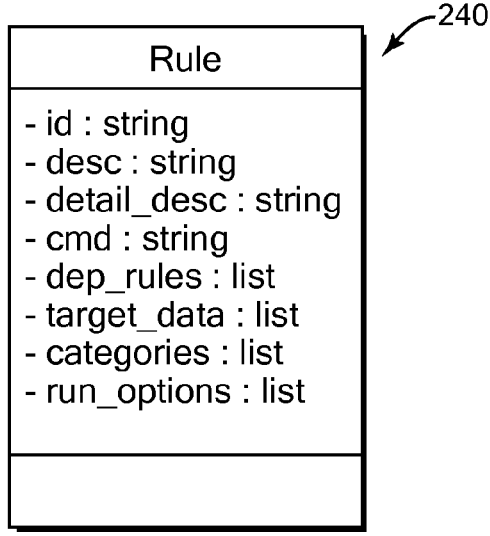
FIG. 6 is a block diagram illustrating example fields of a rule class.

In one non-limiting example, a rule can have several fields. Some of these fields can include: a unique identification (ID), a brief description of the rule, an optional detailed description of the rule, and one or more commands to invoke and execute the rule (e.g., written in SKILL or other language). In addition, a number of optional fields can be included to define the attributes of a rule. Such fields can include one for specifying a list of dependencies on other rules, upon whose outcome this rule depends. Other optional attribute fields can provide a list of target data (e.g., library or cell) to which the rule is operative to be applied, a list of categories used for classifying the rule (e.g., facilitating rule searching when building scenarios or rule policies or selecting a rule to be applied), and a set of run time options used to configure a parameterized rule. For example, the run-time options field in a rule can specify such run-time options 170 similar to those described above in the interface 150. These examples of the fields of a rule are shown in the block diagram of FIG. 6 showing the rule class 240. In some embodiments, the attribute fields of a rule can be overridden by polices or user-selected options (e.g., in interface 150).

An illustrative example of rules provided in XML format is listed below in Listing 1.

Listing 1

```
<rule id="rule_ade__1" desc="ADE Parameter Checker"
   detail_desc="The ADE Parameter checker rule will
traverse both the ADE state(s), and the design description and
determine which <b>design</b> parameters are represented
as ADE states. Any parameters which are missing a corre-
sponding ADE design variable are flagged."
   categories="medium ade_state">
   <cmd lang="SKILL">ade_check_parameters( )/cmd>
</rule>
<rule id="rule_ade__2" desc="ADE View Binding"
   categories="fast ade_state" dep_rules="rule_ade__1">
   <target_data>
   <apply_to>cell</apply_to>
   <cell>design_top</cell>
   </target_data>
   <run_options>
   <mode>Interactive</mode>
   <type>Full</type>
   <auto_fix>
      <enabled>True</true>
      <auto_checkout>False</auto_checkout>
      <respect_ownership>True</respect_ownership>
```
```
   </auto_fix>
   <auto_delete>
      <enabled>False</enabled>
      <report_unrecognized>True</report_unrecognized>
      <debug_mode>False</debug_mode>
   </auto_delete>
   <output>
      <run_dir>/tmp/cds_dblia17017</run_dir>
      <log_file>/tmp/ade_view_binding.log</log_file>
   </output>
   </run_options>
   <cmd lang="SKILL">ade_check_view_binding( )/cmd>
</rule>
<rule id="rule_ade__3" desc="ADE Floating Nodes"
   categories, "ade_state slow" dep_rules="rule_ade__2">
   <cmd lang="SKILL">ade_check_floating_nodes( )/cmd>
</rule>
```

The first rule in the listing above, having the rule ID of "rule_ade__1," has a self-documented detailed description, "detail_desc." Such a description, or portions thereof, can in some embodiments be "marked up" with particular commands allowing display options of text in this description. For example, in this example, the term <b>design</b> will cause the word "design" to be displayed in bold when this description field is rendered according to the Rich Text HTML Subset. This first rule also includes the optional category attribute field, and specifies two categories, "medium" and "ade_state," under which this rule may be classified for search or other purposes. For example, these categories can be used to populate menus and/or search filters 184 in a GUI such as the GUI shown in FIG. 3B. Finally, the first rule lists its executable command as the "ade_check_parameters( )" function, which is a function in the SKILL language. In one example, this function can check the parameters provided in ADE (Analog Design Environment) cellviews, which are views of cells provided in an environment for simulating and analyzing analog and RF designs. Thus this executable command executes a function to check parameters of the design in the target data, such as the frequency at which the circuit operates, voltage values, component values, etc. and check for corresponding design variables as required by the environment. Functions and scripts to implement such checks and other types of checks are well-known to those of skill in the art.

The second rule in the listing, having the ID of "rule_ade__2," includes several attribute fields including categories, dependencies ("dep_rules"), target data, and run options. The category attribute specifies two categories, "fast" and "ade_state," under which the rule may be classified. The dependency field specifies a dependency on the first rule "rule_ade__1." This dependency causes the second rule to depend on the first rule, such that the second rule will not be applied or executed if the first rule (which is applied first) is found to be violated by the target data. The target data attribute specifies default target data that (in the absence of any override) will be the target of the verification check applied by this rule using linter engine 102. In the present example, the default target data is a cell named "design_top." The run options attribute lists several default run options, which will be used in the absence of any override. For example, the listed run options include mode, type, auto-fix options, auto-delete options, and output options. Finally, the second rule lists its executable command (in SKILL format) as the "ade_check_view_binding( )" function, which in one example performs checks that the views bound to the target data cell are correct (as based on other information about the design accessed by the linter engine).

The third rule in the listing, having the ID of "rule_ade_3," includes category and dependency attributes. This rule depends on the second rule "rule_ade_2," provides a set of categories of "ade_state" and "slow," and provides an executable SKILL command of "ade_check_floating_nodes( )" In one example, this command causes the linter engine or EDA application to examine one or more views of the target data and check for nodes that are floating, such as wires being disconnected from a circuit. For example, such disconnections may not cause obvious errors in a simulation, but can cause errors in the operation of the design at a later point, and are therefore desirable to be checked in a verification process of the design.

In each of these examples, the particular commands and rules which are executed can vary depending on the target data, stage of design process, overrides, and other factors.

Rule Libraries

A rule library includes groups of rules. The following illustrative XML example delimits each rule group via the <rules></rules> tags, but a rule group can be delimited or designated in other ways in other embodiments. Each rule group can be further associated with one or more categories such that all rules contained within a group automatically inherit the group categories. Rule libraries containing such rule groups can be provided in one or more files in the filesystem. An example rule library file is listed below in Listing 2, again provided in an XML format as an example, in a file "rules.xml."

Listing 2

```
<?xml version, "1.0" encoding="ISO-8859-1"?>
<rules categories="major">
    {% block major_category %}
    <rule id="rule_ade_1" desc="ADE Parameter Checker"
    detail_desc="The ADE Parameter checker rule will
        traverse both the ADE state(s), and the design descrip-
        tion and determine which <b>design</b> parameters
        are represented as ADE states. Any parameters which
        are missing a corresponding ADE design variable are
        flagged."
    categories="medium ade_state">
    <cmd lang="SKILL">ade_check_parameters( )/cmd>
</rule>
<rule id="rule_ade_2" desc="ADE View Binding"
    categories="fast ade_state" dep_rules="rule_ade_1">
    <target_data>
    <apply_to>cell</apply_to>
    <cell>design_top</cell>
    </target_data>
    <cmd lang="SKILL">ade_check_view_binding( )/cmd>
</rule>
<rule id="rule_ade_3" desc="ADE Floating Nodes"
    categories="ade_state slow" dep_rules="rule_ade_2">
    <cmd lang="SKILL">ade_check_floating_nodes( )/cmd>
</rule>
{% block extra_major_category %} {% endblock %}
{% endblock %} <!-- major category -->
</rules>
<rules categories="abstract fast">
    <!-- some more rules for abstracts etc -->
    <rule id="rule_abgen_1" desc="Abstract terminal check"
    categories="gen1">
    <cmd lang="SKILL">abgen_check_term( )/cmd>
</rule>
<rule id="rule_abgen_2" desc="Abstract layer check"
    categories="gen1">
    <cmd lang="SKILL">abgen_check_layers( )/cmd>
</rule>
</rules>
<rules categories="constraint slow">
    <!-- some more rules for constraints etc -->
    <rule id="rule_ci_1" desc="Ensure symmetrical con-
straints use legal axes"
    categories="ci" >
    <cmd lang="SKILL">ci_check_term( )/cmd>
</rule>
<rule id="rule_ci_2" desc="Module Generator constraint
checker" categories="ci">
    <cmd lang="SKILL">ci_check_modgen( )/cmd>
</rule>
<rules>
```

The above-listed library file rules.xml includes three groups of rules. The first group of rules adds a category "major" to each the three rules included in the group, namely, "rule_ade_1," "rule_ade_2," and "rule_ade_3." The second group of rules adds categories "abstract" and "fast" to each of the two rules included in that group, namely, "rule_abgen_1" and "rule_abgen_2." Likewise, a third group of rules adds categories "constraint" and "slow" to each of the two rules in that group, namely, "rule_ci_1" and "rule_ci_2." Each rule provides its mandatory executable command via the <cmd> . . . </cmd>tags, and some additional optional attributes. For example, the rule "rule_ade_2" states that the target data is the cell "design_top." Some non-XML text is also included, using the terms "block" and "endblock" which are used in template-customization and inheritance (described below).

Policies

A policy includes a collection of rules and/or sub-policies to be applied to target data. The policy includes a list of rules to be checked during the verification process of the target data. The policy also includes customizable policy options ("general options"), which can set the options and/or override default options set forth in a sub-policy, or override default attributes set forth in a rule. The policy options themselves can also be overridden by customizable policy options set forth in a higher-level policy or by run time options specified at the time of executing the policy (e.g., in an interface such as interface 150). By allowing a policy to reference other policies such as sub-policies and rules, a hierarchical policy definition model is employed that can be decomposed into the smaller building blocks of sub-policies, which can be decomposed into smaller building blocks of rules.

Figure 7:
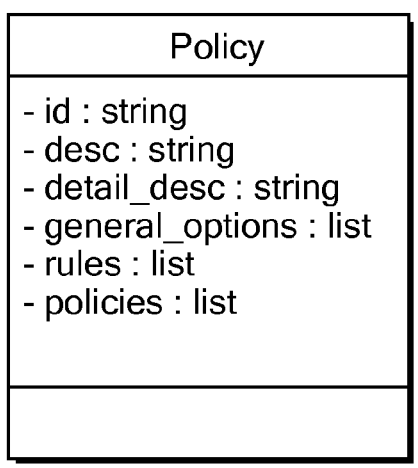
FIG. 7 is a block diagram illustrating example fields of a policy class.

In one non-limiting example, a policy can have several fields. In one example, these fields can include a unique identification (ID), a brief description of the policy, an optional detailed description of the policy, defaults for general options (policy options or parameters) influencing the verification process using the policy, an optional list of rules which are instantiated for execution (including optional overrides for rule attributes), and an optional list of sub-policies which are instantiated for execution (including optional overrides for the policy options of the sub-policies). A sub-policy is a policy that can include one or more rules and/or one or more of its own lower-level sub-policies. The rules included in each sub-policy and any descendants of the sub-policies are found and applied during the execution of the policy. Some of these examples of the fields of a policy are shown in the block diagram of FIG. 7 showing the policy class 250.

Thus, policy definitions are recursive in nature, such that in addition to rule instantiation, a policy definition can instantiate additional policies, which in turn can instantiate further policies and/or rules, and so on. The rules are considered to be "leaf level" in the hierarchy expansion, i.e., the lowest level of the hierarchy structure. In some embodiments, at least one rule should be provided in the expanded hierarchy of a policy.

The excerpt below in Listing 3 is an example of a policy named "example_policy," again provided in an XML format as an example. This policy instantiates multiple rules (two in this example).

Listing 3

```
<def_policy id="example_policy" desc="A policy containing 2 rules only">
<rule ref="rule_connectivity_99">
   <target_data>
   <apply_to>library</apply_to>
   <library>zambezi45</library>
   </target_data>
   <run_options>
   <mode>Interactive</mode>
   <type>Full</type>
   <auto_fix>
      <enabled>True</true>
      <auto_checkout>False</auto_checkout>
      <respect_ownership>True</respect_ownership>
   </auto_fix>
   <auto_delete>
      <enabled>False</enabled>
      <report_unrecognized>True</report_unrecognized>
      <debug_mode>False</debug_mode>
   </auto_delete>
   <output>
      <run_dir>/tmp/cds_dblia17017</run_dir>
      <log_file>/tmp/ade_view_binding.log</log_file>
   </output>
   </run_options>
</rule>
<rule ref="rule_ade_2">
   <target_data>
   <apply_to>library</apply_to>
   <library>zambezi45</library>
   </target_data>
</rule>
. . .
</def_policy>
```

In the above example of Listing 3, the policy "example_policy" instantiates two rules, having the references "rule_connectivity_99" and "rule_ade_2," that are to be executed when the policy is executed. Both of these rule instantiations supply overrides for the attributes specified in the "target_data" sections of these rules. Additionally, the first rule instantiation of "rule_connectivity_99" supplies overrides for the "run_options" attributes. When this policy is executed, these override attributes will take precedence over and override any corresponding attributes provided in the instantiated rules. The instantiation of second rule "ade_rule_2" does not include "run_options" overrides, and so the "run_options" defaults provided in the definition of the second rule will be used when this policy is applied (i.e., when the rules are executed). Examples of the run_option defaults for the second rule are described above in Listing 1.

In another example of a policy, policy options are included and sub-policies are instantiated in the policy. The following listing in Listing 4 includes three policy definitions, defined via the <def_policy> . . . </def_policy>tags, the three sub-policies being named "pre_tape_out," "post_tape_out," and "tape_out." The first two policy definitions have their contents snipped for brevity, and the focus is on the third policy, "tape_out." This third sub-policy references or instantiates the first two sub-policies via use of the <policy> . . . </policy>tags, and provides some general option (policy option) overrides for the second sub-policy.

Listing 4

```
<def_policy id="pre_tape_out" desc="pre-tape out check policy">
   <general_options> <!-defaults for pre-tape-out policy application, Policy 1 -->
      <ignore_cells>
         <ignore_cell>nand3</ignore_cell>
         <ignore_cell>inv</ignore_cell>
         <ignore_cell>nand2</ignore_cell>
      </ignore_cells>
      <ignore_views>
         <ignore_view>verilog</ignore_view>
         <ignore_view>symbol<kignore_view>
      </ignore_views>
      <report_unrecognized>False</report_unrecognized>
   </general_options>
   <rule ref="rule_connectivity_99">
   . . .
   </rule>
   . . .
</def_policy> <!-- end of pre_tape_out, Policy 1 -->
<def_policy id="post_tape_out" desc="post-tape out check policy">
   . . . <!-- [Policy 2] -->
</def_policy> <!-- end of post_tape_out, Policy 2 -->
<def_policy id="tape_out" desc="policy for tape out checks">
   <!-- [Policy 3] policy definitions have some default options (parameters), and can reference (i.e. instantiate) both rules and other (sub) policies -->
   <general_options>
      <ignore_cells>
         <ignore_cell>opamp</ignore_cell>
         <ignore_cell>diffamp</ignore_cell>
         <ignore_cell>comparator</ignore_cell>
      </ignore_cells>
      <ignore_views>
         <ignore_view>schematic</ignore_view>
         <ignore_view>layout</ignore_view>
      </ignore_views>
      <report_unrecognized>True</report_unrecognized>
   </general_options>
   <!-- Run the pre-tape-out policy (Policy 1) -->
   <policy ref="pre_tape_out">
   </policy>
   <!-- Run the rule rule_ade_2 -->
   <rule ref="rule_ade_2">
   <target_data>
      <apply_to>library</apply_to>
      <library>zambezi45</library>
   </target_data>
   </rule>
   <!-- Run the post-tape-out policy (Policy 2) -->
   <policy ref="post_tape_out">
   <general_options> <!-- overrides for post-tape-out policy (Policy 2) -->
      <ignore_cells>
         <ignore_cell>nand3</ignore_cell>
         <ignore_cell>inv</ignore_cell>
         <ignore_cell>nand2</ignore_cell>
      </ignore_cells>
      <ignore_views>
         <ignore_view>verilog</ignore_view>
         <ignore_view>symbol</ignore_view>
```

</ignore_views>
		<report_unrecognized>True</report_unrecognized>
	</general_options>
</policy>
</def_policy> <!-- end of tape_out, Policy 3 -->

The "tape out" policy (third policy listed above, Policy 3) declares its own option defaults under the "general options" section. This policy then lists code to instantiate the "pre_tape_out" policy (Policy 1) via the "policy ref="pre_tape_out">" statement. No policy options are specified to override the parameters of Policy 1, so the default options of Policy 1 will be applied to the target data during the verification process. The "tape_out" policy then lists code to instantiate the rule "rule_ade_2," which is accessible via a rule library. The "tape_out" policy finally lists code to instantiate the "post_tape_out" policy (Policy 2), and includes option overrides in the "general options" section to override the default options of the instantiated Policy 2.

Templates and Inheritance

Templates allow inheritance of rules and policies defined in a template file into another file separate from the template file. In the examples described herein, templates use a placeholder syntax of "block" and "endblock" to designate blocks or sections of the template file that can be changed by the inheriting file. For example, the syntax "{% block <name> %}" can be used to indicate the beginning of a block, with the "{% endblock %}" syntax used to end the block. Other syntax or block indicators can be used in other embodiments. Template placeholder syntax can be placed anywhere within a rule library, rule, or policy definition. Any rule library, rule, or policy definition file that includes template placeholder syntax is referred to herein as a "base template" and can be inherited by a separate extension file.

Figure 8:
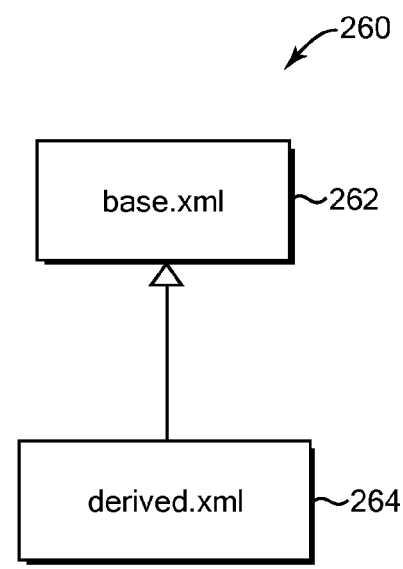
FIG. 8 is a block diagram illustrating one example of a representation of an inheritance relationship between a base template file and an extension file.

An extension file (or derived file) separate from the base template file is used to inherit and/or extend the contents of the base template file by referencing the base template file. In some examples described herein, the syntax of "{% extends <base.xml>%}" is used, where the "extends" term indicates to inherit the contents of a base template, and the "base.xml" term is the name of the base template file that includes the contents or code to inherit. The extension file can also change any blocks included in the base template by referring to the same block placeholders in the extension file and providing different code between those placeholders. This different code replaces or adds to the code inherited from the base template between the original block placeholders. FIG. 8 shows an example of a UML representation of the inheritance relationship between a "base.xml" base template file and a "derived.xml" extension file.

Rule Inheritance

The previously-listed example of Listing 2 shows the contents of a base template file "rules.xml," in which three rules are listed. A template block is the code listed between the syntax of "{% block major_category %}" and "{% endblock %}," where "major_category" is the name of the block (the block reference). Furthermore, another block "extra_major_category" is nested within the major_category block, with the line having the code "{% block extra_major_category %} {% endblock %}" immediately following. The "extra_major_category" block includes no defined rules or policies in this base template file.

In this example, an extension file named "derived_rules.xml" is provided to inherit from (or extend) the base template "rules.xml." An example "derived_rules.xml" file is listed below in Listing 5.

Listing 5

```
{% extends "rules.xml" %}
{% block extra_major_category %}
    <rule id="rule_ade_4" desc="ADE Invalid Outputs"
    categories, "ade_state medium">
    <cmd lang="SKILL">ade_check_invalid_outputs( )/cmd>
    </rule>
{% endblock %}
```

The "derived_rules.xml" extension file first declares its inheritance mechanism with the "extends" syntax, i.e., that it extends and inherits from the "rules.xml" file. Thus the "derived_rules" file includes the entire listing of the "rules.xml" file as its initial contents. The "major_category" block reference in the "rules.xml" file is not defined in the inheriting file "derived_rules.xml." Thus, no effect is made on the code lines provided in the rules.xml file in the "block major_category" section and those code lines remain the same in the "derived_rules.xml" file after inheritance. However, the "derived.xml" file redefines (or overrides) the "extra_major_category" block of the base template rules.xml file by specifying the "block" and "endblock" syntax and listing additional code between those syntax lines. In this example, this causes an extra rule, "rule_ade_4," to be added to the context defined by the "{% block extra_major_category %} ... {% endblock %}" of the base template rules.xml file, thus adding a rule to the "major_category" rule group.

The resulting effective set of rules in the extension file "derived.xml," after the inheritance mechanism is applied, is therefore the same as shown in Listing 2, except that the line stating "{% block extra_major_category %} {% endblock %}" has been replaced by the "rule_ade_4" code in the "derived_rules.xml" file shown above, between the "{% block extra_major_category %}" and "{% endblock %}" lines. Also, the lines stating "{% block major_category %}" and "{% endblock %}" are removed after the inheritance has occurred.

In another example, an extension file "derived_rules_all.xml" is used to inherit the "rules.xml" instead of the "derived_rules.xml" file in the Listing 5 example above. An example listing of this extension file "derived_rules_all.xml" follows in Listing 6.

Listing 6

```
{% extends "rules.xml" %}
{% block major_category %}
    <rule id="rule_ade_5" desc="ADE Invalid State"
    categories, "ade_state medium">
    <cmd lang="SKILL">ade_check_invalid_state( )/cmd>
    </rule>
{% endblock %}
{% block extra_major_category %}
    <rule id="rule_ade_99" desc="ADE integrity check"
    categories, "ade_state medium">
    <cmd lang="SKILL">ade_check_integrity( )/cmd>
    </rule>
{% endblock %}
```

This extension file overrides defaults in the original "major_category" block in addition to overriding the defaults for the "extra_major_category" block as in the prior example. Specifically, this file lists a rule "rule_ade_5" in the "major_category" block. This causes the entire "major category" block in the "rules.xml" file to be inherited by the "derived_rules_all.xml" file and then replaced with the "rule_ade_5" code. That is, all the code lines describing the rules "rule_ade_1," "rule_ade_2," "rule_ade_3," and the "extra_major_category" block from the base template file are (in the extension file) replaced with the lines in the "major_category" block of the "derived_rules_all.xml" file for the "rule_ade_5" rule.

This extension file also includes a block for the "extra_major_category" block. However, since the replacement of the "major_category" block from the "rules.xml" file has also removed the "extra_major_category" block from the "rules.xml file," there is no longer any reference to this block. Therefore, there is no reference in the code from the "rules.xml" file to replace with the corresponding block contents in the "derived_rules_all.xml" file, i.e., the code lines referring to the rule "rule_ade_99" no longer have any block to replace from the "rules.xml" file after the "major_category" block has been replaced. The "extra_major_category" block in the "derived_rules_all.xml" file is therefore ignored.

Policy Inheritance

Policies can also support inheritance using templates and placeholders. For example, policy definitions can support inheritance via a block tagging mechanism similar to the one described above, similarly as rules and rule groups. The following example policy definition file "scenario.xml" in Listing 7 is a base template file that defines some example policies (the details of the first two policies are removed for brevity).

Listing 7

```
<?xml version, "1.0" encoding="ISO-8859-1"?>
<def_policy id="pre_tape_out" desc="pre-tape out check policy">
   . . .
</def_policy><!-- pre_tape_out -->
   . . .
<def_policy id="post_tape_out" desc="post-tape out check policy">
   . . .
</def_policy><!-- post_tape_out -->
<def_policy id="tape_out" desc="policy for tape out checks">
   <!-- policy definitions have some default options (parameters), and can reference (i.e. instantiate) both rules and other (sub) policies -->
   <general_options>
      <ignore_cells>
         <ignore_cell>opamp</ignore_cell>
         <ignore_cell>diffamp</ignore_cell>
         <ignore_cell>comparator</ignore_cell>
      </ignore_cells>
      <ignore_views>
         <ignore_view>schematic</<ignore_view>
         <ignore_view>layout</<ignore_view>
      </ignore_views>
      <report_unrecognized>True</report_unrecognized>
   </general_options>
   <!-- some sub-policies to reference/instantiate. Their own default options (parameters) can be overridden here -->
   <!-- Run the pre-tape-out policy -->
   <policy ref="pre_tape_out"></policy>
   <!-- allow subclasses to instantiate additional pre-tape out policies/rules -->
{% block pre_tape_out_policies %}{% endblock %}
   <!-- some additional rules to run in addition to these policies, along with some rule option overrides -->
   <rule ref="rule_ade_2">
      <target_data>
         <apply_to>library</apply_to>
         <library>zambezi45</library>
      </target_data>
      <run_options>
         . . .
      </run_options>
   </rule>
{% block other_rules %} {% endblock %}
   <!-- Run the post-tape-out policy -->
   <policy ref="post_tape_out"></policy>
   <!-- Run any other post_tape_out policies a subclass might supply -->
{% block post_tape_out_policies %}{% endblock %}
</def_policy><!-- tape out -->
```

In the example Listing 7, within the "tape_out" policy, just after the "pre_tape_out" policy is referenced, a template placeholder block for the block "pre_tape_out_policies" follows. This is then followed with a rule listing (currently just listing "rule_ade_2"), followed by another template placeholder block "other_rules." The "other_rules" block is intended to allow any inheriting extension file to add additional rules at the end of the current set of rules (which contains just one rule in this example). After the rules the "post_tape_out" policy is referenced, followed by a third template placeholder block the "post_tape_out_policies" block.

The above example "tape_out" policy has thus been defined with three template blocks as extension points. The first listed template block adds policies from a "pre_tape_out_policies" extension file to the end of the single predefined "pre_tape_out" policy list (which contains just one policy in the base policy). The second template block adds additional rules from an "other_rules" extension file to the list of rules instantiated at the leaf level within this policy. Finally, the third listed template block can add additional policies from a "post_tape_out_policies" extension file after the end of the "post_tape_out" policy (which contains just one sub-policy in the base policy).

One intent of the base template "scenario.xml" file described above is to allow it to be easily subclassed or extended via extension files. One example of an extension file can have the basic form shown in Listing 8.

Listing 8

```
{% extends "scenario.xml" %}
{% block pre_tape_out_policies %}
   <!-- put additional policies here -->
{% endblock %}
{% block other_rules %}
   <!-- put additional rules here -->
{% endblock %}
{% block post_tape_out_policies %}
   <!-- put additional policies here -->
{% endblock %}
```

This extension file allows a user to use templates to easily extend and customize portions of the "scenario.xml" file with additional policies and rules. Below in Listing 9 is shown an example of the above extension file of Listing 8 including more details of additional customized policies and rules added to the base template. The file can be named "derived_scenario.xml," for example.

Listing 9

```
{% extends "scenario.xml" %}
{% block pre_tape_out_policies %}
   <!-- put additional policies here -->
   <policy ref="pre_tape_out2"></policy>
   <policy ref="pre_tape_out3"></policy>
   <policy ref="pre_tape_out4"></policy>
{% endblock %}
{% block other_rules %}
   <!-- put additional rules here -->
   <rule ref="rule_ade_2"></rule>
   <rule ref="rule_de_3"></rule>
   <rule ref="rule_ci_5"></rule>
   <rule ref="rule_le_8"></rule>
```

```
{% endblock %}
{% block post_tape_out_policies %}
    <!-- put additional policies here -->
    <policy ref="post_tape_out2"></policy>
    <policy ref="post_tape_out3"></policy>
{% endblock %}
```

The above "derived_scenario.xml" file extends the "scenario.xml" file described earlier. It adds three "pre_tape_out" policies to the end of the pre-tape out policy list, then it adds four rules ("other_rules") to the end of the (leaf-level) rule list, and finally it adds two additional policies to the post tape out list. The resulting listing for the "derived_scenario.xml" after inheritance therefore looks like Listing 7 above, except that the line "{% block pre_tape_out_policies %} {% endblock %}" is replaced with the four "pre_tape_out" policy lines in Listing 9, the line "{% block other_rules %} {% endblock %}" is replaced with the five rule lines in Listing 9, and the line "{% block post_tape_out_policies %}{% endblock %}" is replaced by the three "post_tape_out" policy lines in Listing 9.

It should be noted that the template system described above using coded template language can be altered in other embodiments. For example, a GUI can be provided to allow users to specify base templates, rules files, and extension files in a graphical format.

Programmable Lookup

Programmable lookup allows the linter engine to look for required policies and rules in particular locations of a file system or storage system. Policy libraries reference policies, and policies can reference both sub-policies and rules. Rules are stored in libraries within rule groups. When a policy references a sub-policy or a rule, the process of locating and loading that sub-policy or rule can operate by following a programmable search path. This allows policies and rules to be published by various different entities (different users, CAD groups, etc.). The programmable search path also allows policies and rules to be located and loaded on an individual basis, e.g., a per-project or per-site basis.

In some embodiments, a sample set of policy and rule libraries can be provided with the linter engine 104 software, stored within particular directories with a particular release. If a user does not override the search using a provided programmable mechanism, these directories will be consulted by default to find policy and rule libraries. For example, the lookup can be customized by specifying the search order in a file (as one example) named "setup.loc," where a list of specified locations indicates to the linter engine to search for policy and rule libraries at those locations in the specified order of the list. Such locations can be directories, files, or other storage locations. One example of "setup.loc" contents can include, in the following order, the current directory, the library definition file, a user work area, a home directory, a project storage area, a user install directory, and a default setup location. Other locations for searching can be used in other embodiments.

Figure 9:
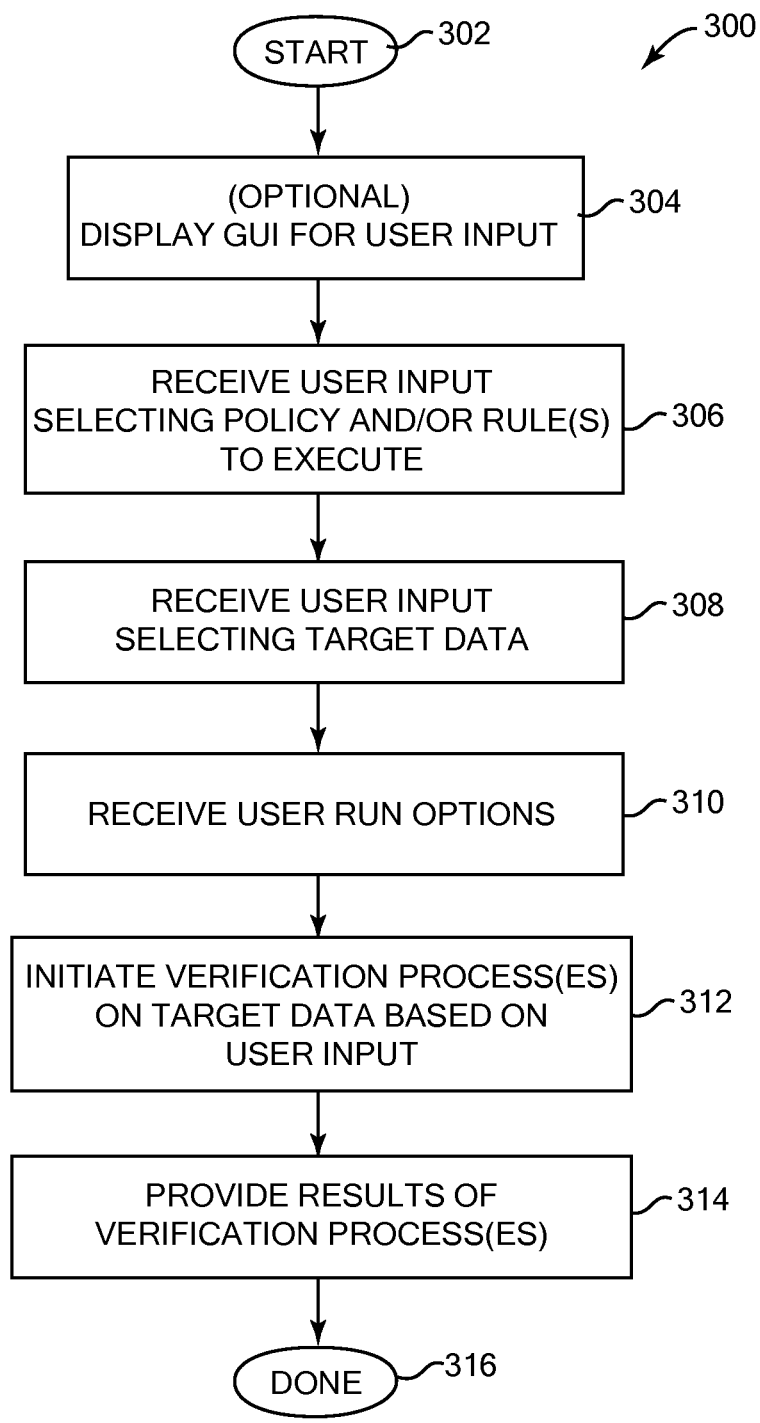
FIG. 9 is a flow diagram illustrating an example method for providing a verification process including features described herein.

FIG. 9 is a flow diagram illustrating an example method 300 for providing a verification process including features described herein. Method 300 (or portions thereof) can be implemented, for example, by the components in system 10 or other system, including one or more CPUs or processors (or processing circuitry) and (optionally) a display device 16. Method 300 can be implemented by software, program instructions or code, which can be stored on a computer readable medium. Alternatively, the method 300 can be implemented in hardware (logic gates, etc.), or in a combination of hardware and software. The method 300 can be provided as part of or component of the linter engine 17, or as a separate program or software running in conjunction with linter engine 17. It should be noted that the steps described below can be performed in a different order than shown and/or simultaneously (partially or completely) with other steps, where appropriate.

This method assumes that policies and rules have previously been created and stored in one or more libraries or other type of databases, and are accessible to a linter engine that performs the verification processes.

The method 300 begins at 302, and in step 304, a GUI can optionally be displayed on a display device to allow a user to input selections for the verification process. In some examples, a GUI such as interface 150 shown in FIGS. 3A and 3B can be displayed, which is receptive to user input in the form of button selections, menu selections, and text input in fields. In other embodiments, other types of interfaces can be provided, such as text interfaces.

In step 306, the linter engine receives user input that selects the policy and/or rule(s) to execute in the verification process, i.e., policy definition 104. For example, the user may have selected a single policy to execute, which includes a number of (sub-)policies and rules. Or the user may have selected a single rule to execute. A filter can be provided to allow the user to select from a subset of the rules, e.g., rules in one or more particular specified categories, as indicated in a category field in each rule. In the examples of FIGS. 3A and 3B, the user can select a policy or rule type, and then filter and/or select the particular policy or rule in drop-down menus. Other selection schemes can be used in other embodiments. An editor can also be launched by the user to modify a selected policy or rule before it is applied. The selected policy and/or rules can be instantiated from the policy libraries 108 and/or rule libraries 110 during run-time, as appropriate.

In step 308, the linter engine receives user input that selects the target data on which the verification process is to be implemented, i.e., the data on which the policy and/or rules selected in 306 are to be applied. The user input can select whether the target data is a library or other type of database, a single cell or other data unit, a group of libraries, a group of cells, or portions of these data structures. For example, in an embodiment such as the interface 150 of FIGS. 3A-3B, the user can select a library or cell as target data using drop-down menus. Other GUI selection interfaces can also be used. In some embodiments, this target data selection may be provided as an override for any default target data policy options and rule attributes specified in the selected policy or rule; the selections in step 308 take precedence over any such default target data options or attributes.

In step 310, the linter engine receives user run options 106 which can specify particular parameters or attributes of the verification process. For example, in the examples of FIGS. 3A-3B, run options include interactive or batch mode, full or incremental verification, automatic fixing or deletion, debug mode, etc. In some embodiments these run options can be overrides for any run option rule attributes and policy options included in the selected rule or policy. The run options 106 can also include user-selected output options in step 310, such as a specification of locations in which to store outputs from the verification process, such as summary reports 118, specific reports 120, and/or logs, as in the output section of the interface 150 of FIGS. 3A and 3B. Some embodiments can also allow a user to create or edit a predetermined ordered list of lookup locations in which the linter engine which look for instantiated policies and rules. In some embodiments, any run options not specified in particular by a user can be provided with defaults includes in rules and policies, and/or by defaults in user preference settings.

In other embodiments, the above-described user input is not directly provided by a user, but is provided by another system or program, or is read from a storage location such as a file or memory.

In step 312, a verification process (or multiple such processes) is initiated by the linter engine on the target data based on the user input received in the steps above. The verification process reads the file(s) storing the selected policy or rule(s), instantiates each specified policy, rule group, and/or rule, and applies them to the target data. This process is described in greater detail below with respect to FIG. 10.

In step 314, the linter engine provides results based on the verification process. In some embodiments, the linter engine can output a summary report 118 and/or policy- or rule-specific reports 120 to a user-designated location on a storage device. Any other outputs can also be provided, such as a log file. Output can also be provided during the verification process, such as during a debug mode of the linter engine. The method is then complete at 316.

Figure 10:
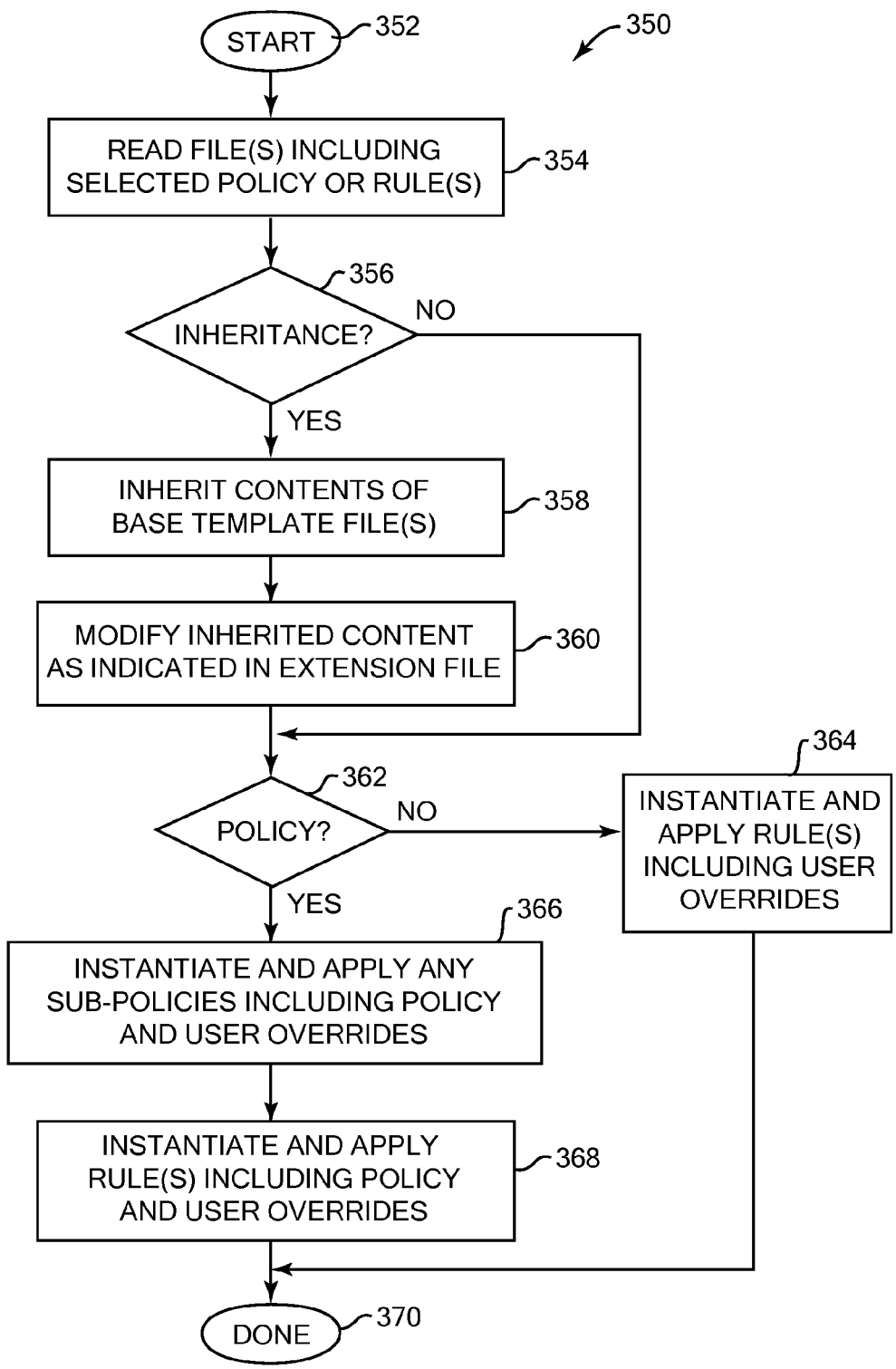
FIG. 10 is a flow diagram illustrating an example method for initiating and performing the verification process step of the method of FIG. 9.

FIG. 10 is a flow diagram illustrating an example method 350 for initiating and performing the verification process step 312 of the method 300 of FIG. 9. The method 350 starts at 352, and in step 354, the linter engine reads one or more files that include the policy or rule selected by the user in step 306 of FIG. 9. In step 356, it is checked whether the file inherits content from one or more base template files, e.g., whether the file is an extension file. If not, then the process continues to step 362, detailed below. If inheritance is present, then in step 358 the contents of the base template file(s) are inherited in the extension file. In step 360, the inherited content is modified as indicated in the extension file. For example, code provided between template block placeholders in the extension file replaces content from the base template file that corresponds to the block placeholders.

In step 362, the process checks whether there are any policies to implement in the read file. If not, then the process continues to step 364, in which the selected rule(s) or rule group are instantiated from the rules library and applied to the target data, including any user overrides. In some embodiments, to apply a rule, the linter engine calls one or more functions provided in a rule to cause the associated verification check to be performed on the target data. The user overrides can be specified for this particular implementation of the rule(s), such as through a user interface 150 or other input or setting, such as target data, categories, run options, etc. The target data, such as data in EDA libraries 114, may be specified by user overrides, or default target data may be specified in the rule definition and used if no user overrides have been received. In some embodiments, the linter engine looks in a programmable order of storage locations to find the instantiated rules in particular rule libraries. The process is then complete at 370.

For example, application of a selected rule may cause a particular verification check on the target data, which in some embodiments can include one or more comparisons to predetermined conditions or standards for determining errors in the target data. In one example, verification checks can include correctness and/or compatibility checks performed on the target data to verify whether the target data satisfies a particular condition of the data and/or the linter engine. In some examples, a condition may be that each cell or cellview have a particular naming convention or up-to-date status, that there is consistent data across all cellviews of cells in the target data, that the target data meets predetermined quality metrics or standards and/or meets electronic constraints or requirements, that automated tasks (e.g., scripts) perform as intended, that data or flow standards are met, or that the database format passes integrity checks. In some embodiments, the verification check can check if predetermined data-gathering metrics are complete, and/or can itself perform the gathering of data metrics to satisfy predetermined requirements. For example, a rule may cause the linter engine (or other program or function) to determine how many transistors, traces, inputs, outputs, or other features or components are provided in target data describing a circuit design.

If there is a selected policy in the file as checked in step 362, then in step 366 any sub-policies in the selected policy are instantiated from the policy library, including applying any policy overrides and any user overrides. The policy overrides may be general options specified in the policy which override any default general options in a sub-policy. The user overrides can be input for this particular implementation of the policy in an interface 150 or other input or setting, and in some embodiments take precedence over any policy overrides. In some embodiments, the linter engine looks in a programmable order of storage locations to find the instantiated sub-policies in particular policy libraries.

In step 368, one or more rule(s) or rule groups that are provided in the selected policy and any existing sub-policies are instantiated from the rules library and applied to the target data, including any policy overrides and user overrides. In some embodiments, the linter engine looks in a programmable order of storage locations to find the instantiated rules in particular rule libraries. Similar to step 364, to apply a rule, the linter engine calls one or more functions provided in a rule to cause the associated verification check to be performed on the target data. The policy overrides may be general options specified in the policy or any of the sub-policies which override any default general options in a sub-policy (higher level policy overrides take precedence over lower level policy overrides). The user overrides can be received through a user interface 150 or other input or setting, and take precedence over any policy overrides. The target data, such as data in EDA libraries 114, may be specified by user overrides, or default target data may be specified in a policy definition or rule definition and used if no user overrides have been received, where the highest-level policy target data takes precedence over lower level policy and rule defaults. The process is then complete at 370.

It should be noted that the order of steps shown in method 350 is only one example. In other embodiments, a different order of steps can be used, or some steps can be performed simultaneously, depending on preference or implementation. For example, multiple rules may be instantiated before any are applied. In some embodiments, a rule may be instantiated and applied before sub-policies are instantiated and applied, e.g., if a rule is specified in a policy outside of any sub-policies.

The features described herein allow a more flexible, extensible, and customizable verification system for checking target data of one or more databases, such as databases and data libraries used in EDA applications. The authoring and storage of the policies and rules (and the scripts which execute them) is separate from the execution of the rules, which greatly facilitates ease of use, and rule re-use. Rules and policies can be extended (inherited) and customized, and policies can be hierarchically decomposed. During rule and policy composition, generic options can be applied or overridden by a user. Furthermore, additional options can be applied to override default options or parameters when applying policies and rules to target data.

Further, a programmable lookup scheme allows site-specific policy library and rule libraries to be located at run time, where different policy and rule libraries can be used for different application-specific tasks or projects. A template-based architecture also allows interactive specifying of inheritance mechanisms and other input to be performed, whether using a textual or file-based mechanism or GUIs. The result is a powerful, configurable and flexible system, which can be deployed in an automated manner. These features allow complex and scattered data to be checked thoroughly for errors and for compliance to a design flow and other requirements, thus reducing time and effort in the completion of and correction of issues in complex designs.

Although the present embodiments have been described in accordance with the examples shown, one of ordinary skill in the art will readily recognize that there could be variations to the embodiments and those variations would be within the spirit and scope of the present inventions. Accordingly, many modifications may be made by one of ordinary skill in the art without departing from the spirit and scope of the appended claims.

What is claimed is:

1. A method for verifying target data that includes circuit data cells and cellviews used in a circuit design, the method comprising:
    receiving an indication of at least one policy, the at least one policy referencing at least one rule, wherein the at least one rule is applied in accordance with a particular stage of multiple stages in a design flow for producing a finalized circuit design; and
    initiating a verification process on the target data using at least one processor by performing at least one verification check on the target data in accordance with the at least one rule, wherein the verification process includes an option to override at least one attribute of the at least one rule and to customize the at least one verification check.

2. The method of claim 1 wherein the target data is stored in at least one database provided on at least one storage device, and wherein the verification process is performed by a linter engine on the target data.

3. The method of claim 2 wherein the at least one database is at least one electronic design automation (EDA) database.

4. The method of claim 2 wherein:
    the at least one policy is stored in a policy library separate from the linter engine and separate from the at least one rule, and wherein the linter engine instantiates the at least one policy from the policy library for the verification process; and
    the at least one rule is stored in a rule library separate from the at least one policy and separate from the linter engine, and wherein the linter engine instantiates the at least one rule from the rule library and applies the at least one rule.

5. The method of claim 1 wherein the at least one policy and the at least one rule are implemented in a hierarchy, wherein the at least one policy references at least one sub-policy stored in a policy library separate from the linter engine and separate from the at least one policy, wherein one or more of the at least one sub-policy references one or more of the at least one rule.

6. The method of claim 1 wherein the at least one verification check includes at least one of: verifying correctness of the target data with respect to the circuit design, verifying that the cellviews are up-to-date, that data across the cellviews is consistent, and that the cellviews meet predetermined quality metrics, verifying that all data meets predetermined flow standards, verifying integrity of at least one database storing the target data, and verifying gathering metrics on a circuit design using the target data.

7. The method of claim 6 wherein verifying correctness of the target data with respect to the circuit design includes verifying consistency among portions of the circuit design.

8. The method of claim 7 wherein verifying correctness of the target data with respect to the circuit design includes verifying that components of the circuit design meet predetermined electronic constraints and physical layout design rules.

9. The method of claim 7 wherein the linter engine checks a user-customized predefined order of locations in a storage system to find the at least one policy and the at least one rule.

10. The method of claim 1 further comprising receiving input from a user in a graphical interface instructing modification of at least one attribute of one or more of the at least one rule, wherein the one or more modified rule is applied to cause the at least one verification check to be performed on the target data.

11. The method of claim 1 wherein the at least one policy is provided in a base template file and is inherited by an extension file referring to the base template file, wherein the extension file includes at least one modification that replaces a corresponding portion of the at least one policy in response to the implementing of the at least one policy.

12. A computer program product comprising a computer readable medium including program instructions to be implemented by a computer and for verifying target data that includes circuit data cells and cellviews used in a circuit design, the program instructions for:
    receiving an indication of at least one policy, the at least one policy including at least one rule, wherein the at least one rule is applied in accordance with a particular stage of multiple stages in a design flow for producing a finalized circuit design; and
    initiating a verification process on the target data using at least one processor by performing at least one verification check on the target data in accordance with the at least one rule, wherein the verification process includes an option to override at least one attribute of the at least one rule and to customize the at least one verification check.

13. The computer program product of claim 12 wherein the target data is stored in at least one database, and wherein the verification process is performed by a linter engine on the target data.

14. The computer program product of claim 13 wherein:
    the at least one policy is stored in a policy library separate from the linter engine and separate from the at least one rule, and wherein the linter engine instantiates the at least one policy from the policy library for the verification process; and
    the at least one rule is stored in a rule library separate from the linter engine, and wherein the at least one policy instantiates the at least one rule from the rule library.

15. The computer program product of claim 14 wherein the at least one verification check comprises verifying correctness of the target data with respect to the circuit design that includes verifying consistency among portions of the circuit design.

16. The computer program product of claim 15 wherein the at least one policy is provided in a base template file and is inherited by an extension file referring to the base template file, wherein the extension file includes at least one modification that replaces a corresponding portion of the at least one policy in response to the implementing of the at least one policy.

17. A verification system for verifying target data that includes circuit data cells and cellviews used in a circuit design, the verification system comprising:
- one or more storage devices storing at least one library including at least one policy and at least one rule, wherein the at least one rule is applied in accordance with a particular stage of multiple stages in a design flow for producing a finalized circuit design; and
- at least one processor in communication with the one or more storage devices, the at least one processor:
  - receiving an indication of the at least one policy, the at least one policy including the at least one rule, wherein the at least one rule is applied in accordance with a particular stage of multiple stages in a design flow for producing a finalized circuit design, and
  - initiating a verification process on the target data using at least one processor by performing at least one verification check on the target data in accordance with the at least one rule, wherein the verification process includes an option to override at least one attribute of the at least one rule and to customize the at least one verification check.

18. The verification system of claim 17 wherein the target data is stored in at least one electronic design automation (EDA) database, wherein the verification process is performed by a linter engine on the target data, and wherein the linter engine instantiates the at least one policy from a policy library and instantiates the at least one rule from a rule library for the verification process.

\* \* \* \* \*